(12) United States Patent
Hirose et al.

(10) Patent No.: US 7,931,820 B2
(45) Date of Patent: Apr. 26, 2011

(54) DRY ETCHING GAS AND METHOD FOR DRY ETCHING

(75) Inventors: Masataka Hirose, Tsukuba (JP); Shingo Nakamura, Settsu (JP); Mitsushi Itano, Settsu (JP); Hirokazu Aoyama, Settsu (JP)

(73) Assignee: Daikin Industries, Ltd., Osaka-Shi (JP)

( * ) Notice: Subject to any disclaimer, the term of this patent is extended or adjusted under 35 U.S.C. 154(b) by 0 days.

(21) Appl. No.: 10/362,973

(22) PCT Filed: Sep. 5, 2001

(86) PCT No.: PCT/JP01/07678
§ 371 (c)(1),
(2), (4) Date: Mar. 6, 2003

(87) PCT Pub. No.: WO02/21586
PCT Pub. Date: Mar. 14, 2002

(65) Prior Publication Data
US 2004/0011763 A1    Jan. 22, 2004

(30) Foreign Application Priority Data
Sep. 7, 2000    (JP) ................................. 2000-271709

(51) Int. Cl.
| C23F 1/00 | (2006.01) |
| B44C 1/22 | (2006.01) |
| C03C 15/00 | (2006.01) |
| C03C 25/68 | (2006.01) |

(52) U.S. Cl. .............. 216/67; 252/79.1; 216/79; 216/80
(58) Field of Classification Search .................... 216/67, 216/79; 252/79.1; 438/710, 719
See application file for complete search history.

(56) References Cited

U.S. PATENT DOCUMENTS

| 5,266,154 | A | | 11/1993 | Tatsumi |
| 5,376,228 | A | * | 12/1994 | Yanagida ...................... 438/714 |
| 5,409,738 | A | * | 4/1995 | Matsunuma et al. ......... 427/502 |
| 5,741,742 | A | * | 4/1998 | Kamide ........................ 438/653 |
| 6,010,968 | A | * | 1/2000 | Yang et al. .................... 438/719 |
| 6,051,870 | A | * | 4/2000 | Ngo .............................. 257/519 |
| 6,080,620 | A | * | 6/2000 | Jeng ............................. 438/253 |
| 6,124,165 | A | * | 9/2000 | Lien ............................ 438/253 |
| 6,133,153 | A | * | 10/2000 | Marquez et al. ............. 438/706 |
| 6,174,451 | B1 | * | 1/2001 | Hung et al. .................... 216/67 |
| 6,174,796 | B1 | * | 1/2001 | Takagi et al. ................. 438/622 |
| 6,187,624 | B1 | * | 2/2001 | Huang ......................... 438/253 |
| 6,191,042 | B1 | * | 2/2001 | Tsai et al. ..................... 438/700 |
| 6,228,774 | B1 | * | 5/2001 | Marquez ....................... 438/710 |
| 6,242,359 | B1 | * | 6/2001 | Misra ............................ 438/710 |
| 6,254,966 | B1 | * | 7/2001 | Kondo .......................... 428/156 |
| 6,297,163 | B1 | * | 10/2001 | Zhu et al. ..................... 438/707 |
| 6,383,403 | B1 | * | 5/2002 | Sekiya et al. ................... 216/70 |
| 6,399,472 | B1 | * | 6/2002 | Suzuki et al. ................. 438/601 |
| 6,407,464 | B1 | * | 6/2002 | Terauchi ....................... 257/296 |
| 6,530,380 | B1 | * | 3/2003 | Zhou et al. ..................... 134/1.2 |
| 6,579,776 | B2 | * | 6/2003 | Terauchi ....................... 438/396 |
| 6,586,324 | B2 | * | 7/2003 | Huang et al. .................. 438/618 |
| 6,617,631 | B2 | * | 9/2003 | Huang .......................... 257/296 |
| 6,617,664 | B2 | * | 9/2003 | Hayashi et al. ............... 257/529 |
| 6,623,652 | B1 | * | 9/2003 | Hsiao et al. ..................... 216/22 |
| 6,693,038 | B1 | * | 2/2004 | Shen ............................ 438/700 |
| 6,753,263 | B1 | * | 6/2004 | Ito et al. ........................ 438/714 |
| 6,784,111 | B2 | * | 8/2004 | Donohoe et al. ............. 438/710 |
| 7,183,222 | B2 | * | 2/2007 | Qiao ............................ 438/723 |
| 2002/0155726 | A1 | * | 10/2002 | Ueda ........................... 438/724 |
| 2004/0248414 | A1 | * | 12/2004 | Tsai et al. ..................... 438/689 |
| 2005/0042859 | A1 | * | 2/2005 | Yu et al. ....................... 438/636 |

FOREIGN PATENT DOCUMENTS

| JP | 9-173773 | 7/1997 |
| JP | 10-27781 | 1/1998 |
| KR | 1999-0048400 | 7/1999 |
| WO | WO98/36449 | 8/1998 |
| WO | WO 98/36449 A1 | 8/1998 |

OTHER PUBLICATIONS

Korean Office Action dated Jan. 5, 2006.

* cited by examiner

*Primary Examiner* — Allan Olsen
(74) *Attorney, Agent, or Firm* — Kratz, Quintos & Hanson, LLP

(57) ABSTRACT

A dry etching gas that comprises a compound having a $CF_3CF$ fragment directly bonded to a double bond (provided that the compound is exclusive of $CF_3CF=CFCF=CF_2$). Said dry etching gas permits the formation of a pattern such as a contact hole with a high aspect ratio.

3 Claims, No Drawings

DRY ETCHING GAS AND METHOD FOR DRY ETCHING

TECHNICAL FIELD

The present invention relates to a dry etching gas and a dry etching method.

BACKGROUND OF THE INVENTION

With the miniaturization of semiconductor devices, the formation of fine patterns such as contact holes with small hole diameter and high aspect ratio and the like becomes a necessity. Conventionally, contact holes and other patterns have been frequently formed by a gas plasma of $c\text{-}C_4F_8/Ar$ ($/O_2$) containing a large amount of Ar. However, cyclic $c\text{-}C_4F_8$ contributes significantly to global warming, and thus its use is likely to be limited in the future. Further, when not combined with Ar, cyclic $c\text{-}C_4F_8$ is insufficient in the resist selectivity and the silicon selectivity. The etching rate of cyclic $c\text{-}C_4F_8$ varies depending on the pattern size without the addition of a small amount of oxygen, and etching stops under fine pattern conditions. On the other hand, the addition of oxygen lowers the selectivity with regard to the resist and the silicon. It has also been reported that when an excess amount of Ar is blended, the number of high-energy electrons increases, thereby damaging devices.

An object of the present invention is to provide a dry etching gas and a dry etching method, which achieves no reduction in etching rate even when etching small-sized holes, lines or the like; little pattern-size dependency, and the formation of a fine, high-aspect-ratio pattern with no etch stopping through the use of the etching gas that has a substantially small effect on global warming.

DISCLOSURE OF THE INVENTION

The present invention provides the following dry etching gases and dry etching methods.

Item 1. A dry etching gas comprising a compound having a $CF_3CF$ fragment directly bonded to a double bond, with the proviso that $CF_3CF\!=\!CFCF\!=\!CF_2$ is excluded.

Item 2. A dry etching gas according to Item 1 comprising a compound represented by the general formula (1):

wherein X and Y are the same or different, and independently represent F, Cl, Br, I, H or $C_aF_bH_c$ ($a=1$ to 3, $b+c=2a+1$).

Item 3. A dry etching gas according to Item 1 comprising a compound represented by the general formula (2):

wherein Z is F, Cl, Br, I, H, $CH_3$, $C_2H_5$, $C_3H_7$, $CF_3$, $C_2F_5$ or $C_3F_7$; m is 0, 1 or 2; and n is 1, 2 or 3.

Item 4. A dry etching gas according to Item 3 comprising $CF_3CF\!=\!CFCF_3$.

Item 5. A dry etching gas according to Item 1 further comprising at least one member selected from the group consisting of noble gases, inert gases, $NH_3$, $H_2$, hydrocarbons, $O_2$, oxygen-containing compounds, iodine-containing compounds, HFC (hydrofluorocarbons), and PFC (perfluorocarbon) gases having at least one single bond or double bond, with the proviso that the compounds disclosed in Item 1 are excluded.

Item 6. A dry etching gas according to Item 1 comprising at least one member of gas selected from the group consisting of noble gases such as He, Ne, Ar, Xe and Kr; inert gases such as $N_2$ and the like; $NH_3$; $H_2$; hydrocarbons such as, $CH_4$, $C_2H_6$, $C_3H_8$, $C_2H_4$, $C_3H_6$ and the like; $O_2$; oxygen-containing compounds such as CO, $CO_2$, $(CH_3)_2C\!=\!O$, $(CF_3)_2C\!=\!O$, $CF_3CFOCF_2$, $CF_3OCF_3$ and the like; iodine-containing compounds such as $CF_3I$, $CF_3CF_2I$, $(CF_3)CFI$, $CF_2\!=\!CFI$ and the like; HFC (hydrofluorocarbons) such as $CH_2F_2$, $CHF_3$, $CF_3CHF_2$, $CHF_2CHF_2$, $CF_3CH_2F$, $CHF_2CH_2F$, $CF_3CH_3$, $CH_2FCH_2F$, $CF_2\!=\!CHF$, $CHF\!=\!CHF$, $CH_2\!=\!CF_2$, $CH_2\!=\!CHF$, $CF_3CH\!=\!CF_2$, $CF_3CH\!=\!CH_2$, $CH_3CF\!=\!CH_2$, $CH_3CHF_2$, $CH_3CH_2F$, $CF_3CF_2CH_2F$, $CF_3CHFCF_3$, $CHF_2CF_2CHF_2$, $CF_3CF_2CH_2F$, $CF_2CHFCHF_2$, $CF_3CH_2CF_3$, $CHF_2CF_2CH_2F$, $CF_3CF_2CH_3$, $CF_3CH_2CHF_2$, $CH_3CF_2CHF_2$, $CH_3CHFCH_3$ and the like; and PFC (perfluorocarbon) gases having at least one single bond or double bond such as $CF_2\!=\!CF_2$, $CF_2\!=\!CFCF\!=\!CF_2$, $CF_3CF\!=\!CFCF\!=\!CF_2$, $c\text{-}C_5F_8$, $CF_4$, $C_2F_6$, $C_3F_8$, $C_4F_{10}$, $c\text{-}C_4F_8$ and the like, with the proviso that the compounds disclosed in Item 1 are excluded.

Item 7. A dry etching method comprising etching a silicon material such as a silicon oxide film and/or a silicon containing, low-dielectric constant film by means of a gas plasma of a dry etching gas comprising a compound having a $CF_3CF$ fragment directly bonded to a double bond, with the proviso that $CF_3CF\!=\!CFCF\!=\!CF_2$ is excluded.

Item 8. A dry etching method according to Item 7 wherein the dry etching gas contains a compound represented by the general formula (1):

wherein X and Y are the same or different, and independently represent F, Cl, Br, I, H or $C_aF_bH_c$ ($a=1$ to 3, $b+c=2a+1$).

Item 9. A dry etching method according to Item 7 wherein the dry etching gas contains a compound represented by the general formula (2):

wherein Z is F, Cl, Br, I, H, $CH_3$, $C_2H_5$, $C_3H_7$, $CF_3$, $C_2F_5$ or $C_3F_7$; m is 0, 1 or 2; and n is 1, 2 or 3.

Item 10. A dry etching method according to Item 7 wherein the dry etching gas contains $CF_3CF\!=\!CFCF_3$.

Item 11. A dry etching method comprising etching a silicon material such as a silicon oxide film and/or a silicon containing, low-dielectric constant film by means of a gas plasma of a dry etching gas comprising:

(i) a compound having a $CF_3CF$ fragment directly bonded to a double bond, with the proviso that $CF_3CF\!=\!CFCF\!=\!CF_2$ is excluded; and (ii) at least one member selected from the group consisting of noble gases, inert gases, $NH_3$, $H_2$, hydrocarbons, $O_2$, oxygen-containing compounds, iodine-containing compounds, HFC (hydrofluorocarbons), and PFC (perfluorocarbon) gases having at least one single bond or double bond, with the proviso that the compounds disclosed in (i) are excluded.

Item 12. A dry etching method according to Item 11 wherein the dry etching gas contains:

(i) a compound having a $CF_3CF$ fragment directly bonded to a double bond, with the proviso that $CF_3CF\!=\!CFCF\!=\!CF_2$ is excluded; and (ii) at least one member of the gases selected from the group consisting of noble gases such as He, Ne, Ar, Xe and Kr; inert gases such as $N_2$ and the like; $NH_3$; $H_2$; hydrocarbons such as $CH_4$, $C_2H_6$, $C_3H_8$, $C_2H_4$ and $C_3H_6$; $O_2$; oxygen-containing compounds such as CO, $CO_2$, $(CH_3)_2C\!=\!O$, $(CF_3)_2C\!=\!O$, $CF_3CFOCF_2$, $CF_3OCF_3$ and the like; iodine-containing compounds such as $CF_3I$, $CF_3CF_2I$, $(CF_3)CFI$, $CF_2\!=\!CFI$ and the like; HFC (hydrofluorocarbons) such as $CH_2F_2$, $CHF_3$, $CF_3CHF_2$, $CHF_2CHF_2$, $CF_3CH_2F$, $CHF_2CH_2F$, $CF_3CH_3$, $CH_2FCH_2F$, $CF_2=CHF$, $CHF=CHF$, $CH_2=CF_2$, $CH_2=CHF$, $CF_3CH=CF_2$, $CF_3CH=CH_2$, $CH_3CF=CH_2$, $CH_3CHF_2$, $CH_3CH_2F$, $CF_3CF_2CF_2H$, $CF_3CHFCF_3$, $CHF_2CF_2CHF_2$, $CF_3CF_2CH_2F$, $CF_2CHFCHF_2$, $CF_3CH_2CF_3$, $CHF_2CF_2CH_2F$, $CF_3CF_2CH_3$, $CF_3CH_2CHF_2$, $CH_3CF_2CHF_2$, $CH_3CHFCH_3$ and the like; and PFC (perfluorocarbon) gases having at least one single bond or double bond such as $CF_2=CF_2$, $CF_2=CFCF=CF_2$, $CF_3CF=CFCF=CF_2$, c-$C_5F_8$, $CF_4$, $C_2F_6$, $C_3F_8$, $C_4F_{10}$, c-$C_4F_8$ and the like, with the proviso that the compounds disclosed in Item 1 are excluded.

The phrase "a $CF_3CF$ fragment directly bonded to a double bond within its molecule" herein refers to a $CF_3CF=C$ structure.

Dry etching gases usable in the present invention include at least one compound having a double bond within its molecule and having a $CF_3CF$ fragment with the proviso that $CF_3CF=CFCF=CF_2$ is excluded (hereinafter sometimes referred to as "etching gas components"), preferably include at least one compound represented by the General Formula (1):

$$CF_3CF=CXY \qquad (1)$$

wherein X and Y are as defined above; and preferably at least one compound represented by the General Formula (2):

$$CF_3CF=CZ_{2-m}(C_nF_{2n+1})_m \qquad (2)$$

wherein Z, m and n are as defined above, more preferably include $CF_3CF=CFCF_3$. These dry etching gases selectively generate $CF_3^+$; an etching reaction layer and a protective layer derived from a high-density, even fluorocarbon polymer film are formed by the radicals generated from $CF_3CF$ fragments; and silicon materials such as a silicon oxide film and/or a silicon containing, low-dielectric constant film are etched.

The etching gas components of the invention include those compounds having a $CF_3CF$ fragment directly bonded to a double bond, preferably include at least one compound represented by the general formula (1):

$$CF_3CF=CXY \qquad (1)$$

wherein X and Y are as defined above. Specific examples are $CF_3CF=CFCF_3$, $CF_3CF=CF_2$, $CF_3CF=C(CF_3)_2$, $CF_3CF=C(C_2F_5)_2$, $CF_3CF=C(C_3F_7)_2$, $CF_3CF=C(CF_3)(C_3F_7)$, $CF_3CF=C(C_2F_5)(C_3F_7)$, $CF_3CF=C(CF_3)(C_2F_5)$, $CF_3CF=CFC_2F_5$, $CF_3CF=CFC_3F_7$, $CF_3CF=CFCl$, $CF_3CF=CClCF_3$, $CF_3CF=CBrCF_3$, $CF_3CF=CFBr$, $CF_3CF=CFI$, $CF_3CF=CICF_3$, $CF_3CF=CH_2$, $CF_3CF=CHF$, $CF_3CF=CHCF_3$, $CF_3CF=CHC_2F_5$, $CF_3CF=CHC_3F_7$, $CF_3CF=CCHF_2CF_3$, $CF_3CF=CCHF_2C_2F_5$, $CF_3CF=CCHF_2C_3F_7$, $CF_3CF=CCH_2FCF_3$, $CF_3CF=CCH_2FC_2F_5$, $CF_3CF=CCH_2FC_3F_7$, $CF_3CF=CCH_3F$, $CF_3CF=CCH_3CF_3$, $CF_3CF=CCH_3C_2F_5$, $CF_3CF=CCH_3C_3F_7$, $CF_3CF=CCHFCF_3$, $CF_3CF=CCHFCF_3CF_3$, $CF_3CF=CCHFCF_3C_2F_5$, $CF_3CF=CCHFCF_3C_3F_7$, $CF_3CF=CCF_2CHF_2F$, $CF_3CF=CCF_2CHF_2CF_3$, $CF_3CF=CCF_2CHF_2C_2F_5$, $CF_3CF=CCF_2CHF_2C_3F_7$, $CF_3CF=CCH_2CF_3F$, $CF_3CF=CCH_2CF_3CF_3$, $CF_3CF=CCH_2CF_3C_2F_5$, $CF_3CF=CCH_2CF_3C_3F_7$, $CF_3CF=CCHFCHF_2F$, $CF_3CF=CCHFCHF_2CF_3$, $CF_3CF=CCHFCHF_2C_2F_5$, $CF_3CF=CCHFCHF_2C_3F_7$ $CF_3CF=CCH_3F$, $CF_3CF=CCH_3CF_3$, $CF_3CF=CCH_3C_2F_5$ and $CF_3CF=CCH_3C_3F_7$.

In the compounds represented by the General Formula (1), a represents an integer of 1 to 3, preferably 1 or 2; b represents an integer of 0 to 7, preferably 3 to 7; and c represents an integer of 0 to 7, preferably 0 to 3.

More preferable etching gas components of the invention include at least one compound represented by the general formula (2):

$$CF_3CF=CZ_{2-m}(C_nF_{2n+1})_m \qquad (2)$$

wherein Z is F, Cl, Br, I, H, $CH_3$, $C_2H_5$, $C_3H_7$, $CF_3$, $C_2F_5$ or $C_3F_7$; m is 0, 1 or 2; and n is 1, 2 or 3.

In the compounds represented by the general formula (2), Z is F, Cl, Br, I, H, $CH_3$, $C_2H_5$, $C_3H_7$, $CF_3$, $C_2F_5$ or $C_3F_7$, preferably, F, I, H, $CH_3$ or $CF_3$, more preferably F or $CF_3$.

In the compounds represented by the general formula (2), m is an integer of 0 to 2, preferably 0 or 1, more preferably 1.

In the compounds represented by the general formula (2), n represents an integer of 1 to 3, preferably 1 or 2, and more preferably 1.

Specific examples of the compounds represented by the General Formula (2) are $CF_3CF=CFCF_3$, $CF_3CF=CF_2$, $CF_3CF=CFC_2F_5$, $CF_3CF=CFC_3F_7$, $CF_3CF=C(CF_3)_2$, $CF_3CF=C(CF_3)(C_2F_5)$, $CF_3CF=C(CF_3)(C_3F_7)$, $CF_3CF=C(C_2F_5)_2$, $CF_3CF=C(C_2F_5)(C_3F_7)$, $CF_3CF=C(C_3F_7)_2$, $CF_3CF=CH_2$, $CF_3CF=CHF$, $CF_3CF=CHCF_3$, $CF_3CF=CHC_2F_5$, $CF_3CF=CHC_3F_7$, $CF_3CF=CCH_3F$, $CF_3CF=CCH_3CF_3$, $CF_3CF=CCH_3C_2F_5$, $CF_3CF=CCH_3C_3F_7$, $CF_3CF=CC_2H_5F$, $CF_3CF=CC_2H_5CF_3$, $CF_3CF=CC_2H_5C_2F_5$, $CF_3CF=CC_2H_5C_3F_7$, $CF_3CF=CC_3H_7F$, $CF_3CF=CC_3H_7CF_3$, $CF_3CF=CC_3H_7C_2F_5$, $CF_3CF=CC_3H_7C_3F_7$, $CF_3CF=CFCl$, $CF_3CF=CClCF_3$, $CF_3CF=CBrCF_3$, $CF_3CF=CFBr$, $CF_3CF=CFI$ and $CF_3CF=CICF_3$.

Preferred examples of the dry etching gases of the invention are $CF_3CF=CFCF_3$, $CF_3CF=CF_2$, $CF_3CF=CFC_2F_5$, $CF_3CF=C(CF_3)_2$, $CF_3CF=C(CF_3)(C_2F_5)$, $CF_3CF=C(C_2F_5)_2$, $CF_3CF=CH_2$, $CF_3CF=CHF$, $CF_3CF=CHCF_3$, $CF_3CF=CHC_2F_5$, $CF_3CF=CCH_3F$, $CF_3CF=CCH_3CF_3$, $CF_3CF=CCH_3C_2F_5$, $CF_3CF=CFI$ and $CF_3CF=CICF_3$.

As the dry etching gas of the invention, the etching gas component may be used in combination with at least one member (hereinafter sometimes referred to as a "combined gas component") selected from the group consisting of noble gases such as He, Ne, Ar, Xe and Kr; inert gases such as $N_2$ and the like; $NH_3$; $H_2$; hydrocarbons such as $CH_4$, $C_2H_6$, $C_3H_8$, $C_2H_4$, $C_3H_6$ and the like; $O_2$; oxygen-containing compounds such as CO, $CO_2$, $(CF_3)_2C=O$, $CF_3CFOCF_2$ and the like; iodine-containing compounds such as $CF_3I$, $CF_3CF_2I$, $(CF_3)CFI$, $CF_2=CFI$ and the like; HFC (hydrofluorocarbons) such as $CH_2F_2$, $CHF_3$, $CF_3CHF_2$, $CHF_2CHF_2$, $CF_3CH_2F$, $CHF_2CH_2F$, $CF_3CH_3$, $CH_2FCH_2F$, $CH_3CHF_2$, $CH_3CH_2F$, $CF_3CF_2CF_2H$, $CF_3CHFCF_3$, $CHF_2CF_2CHF_2$, $CF_3CF_2CH_2F$, $CF_2CHFCHF_2$, $CF_3CH_2CF_3$, $CHF_2CF_2CH_2F$, $CF_3CF_2CH_3$, $CF_3CH_2CHF_2$, $CH_3CF_2CHF_2$, $CH_3CHFCH_3$, $CF_2=CHF$, $CHF=CHF$, $CH_2=CF_2$, $CH_2=CHF$, $CF_3CH=CF_2$, $CF_3CH=CH_2$, $CH_3CF=CH_2$ and the like; and PFC (perfluorocarbon) gases having at least one single bond or double bond between carbon and carbon such as $CF_2=CF_2$, $CF_2=CFCF=CF_2$, $CF_3CF=CFCF=CF_2$, c-$C_5F_8$, $CF_4$, $C_2F_6$, $C_3F_8$, $C_4F_{10}$, c-$C_4F_8$ and the like, with the proviso that the compounds disclosed in Item I above are excluded).

A noble gas such as He, Ne, Ar, Xe, Kr or the like can change the electron temperature and the electron density of the plasma and also has a diluting effect. Through the simultaneous use of such a noble gas, a suitable etching condition can be selected by controlling the balance among fluorocarbon radicals and fluorocarbon ions.

With $N_2$, $H_2$ or $NH_3$ in the combination, excellent etching shape is obtained in the etching of low-dielectric constant films.

Hydrocarbons and HFC improve the etching selectivity by depositing, within the plasma, a carbon-rich polymer film onto the etching-mask, i.e., resist and other underlying layers. Further, HFC itself has an effect of generating ions that are used as etching species.

The term "oxygen-containing compounds" refers to those compounds containing oxygen, for example, CO; $CO_2$; ketones such as acetone, $(CF_3)_2C=O$ and the like; epoxides such as $CF_3CFOCF_2$ and the like; and ethers such as $CF_3OCF_3$ and the like. When these oxygen-containing compounds or $O_2$ is used in combination, etch-stop is prevented by suppressing the decrease of the etching rate in the etching of fine patterns (microloading effect).

Japanese Unexamined Patent Application No. 340211/1999, *Jpn. J. Appl. Rhys.* Vol. 39 (2000) pp 1,583-1,596, etc., disclose iodine-containing compounds such as $CF_3I$, $CF_3CF_2I$, $(CF_3)_2CFI$, $CF_2CFI$ and the like. These iodine-containing compounds are preferably used in combination because they are useful for increasing the electron density, and some of them selectively produce $CF_3^+$.

HFC and PFC that have a double bond within their molecules have little effect on global warming, and such a double bond is likely to dissociate in the plasma, and therefore it is easy to control the generation of radicals and ions necessary in etching.

When, as the dry etching gas of the invention, a mixed gas containing an etching gas component and a combined gas component is used, usually, at least one etching gas component is used in a flow rate of about 10% or more, and at least one combined gas component is used in a flow rate of about 90% or less. Preferably, at least one etching gas component is used in a flow rate of about 20 to about 95%, and at least one combined gas component is used in a flow rate of about 5 to about 80%. Preferable examples of combined gas components include at least one species selected from the group consisting of Ar, $N_2$, $O_2$, CO, $CF_3I$ and $CH_2F_2$.

Table 1 shows a comparison of positive ions and fluorocarbon films formed in the plasma of the preferable dry etching gas of the present invention, i.e., $CF_3CF=CFCF_3$ and in the plasma of a conventional etching gas, i.e., c-$C_4F_8$, generated under the discharge incident power of 600 W and pressure of 3 mTorr (0.399 Pa).

TABLE 1

| | $CF_3^{30}$ content (%) | Ra*[1] (nm) | Fluorocarbon film density *[2] | $CF_x$ (x = 1 to 3) radical density ($10^{12}$/cm$^3$) | | |
|---|---|---|---|---|---|---|
| | | | | CF | $CF_2$ | $CF_3$ |
| $CF_3CF=CFCF_3$ | 35 | 0.8 | $2.5 \times 10^{-4}$ | 0.45 | 0.6 | 4.0 |
| c—$C_4F_8$ | 19 | 1.8 | $2.3 \times 10^{-4}$ | 0.55 | 1.2 | 5.0 |

*[1]Ra: Fluorocarbon film surface roughness (deviation from mean surface roughness, in nanometers).
*[2]Fluorocarbon film density: FT-IR absorbance normalized based on film thickness (maximum peak intensity/film thickness in nanometers).

In plasmas having high dissociation, such as an inductively-coupled plasma and the like used to evaluate the positive ion content and the fluorocarbon films formed in the gas plasmas of $CF_3CF=CFCF_3$ and c-$C_4F_8$, most of the positive ions are $CF^+$, which have a low etching efficiency, and there are few $CF_3^+$, which have a high etching efficiency. Conventional gases using c-$C_4F_8$ generate a relatively large amount of $CF_3^+$. More $CF_3^+$ is generated by using $CF_3CF=CFCF_3$ than by using c-$C_4F_8$, with the result that $CF_3^+$ account for 30% or more of the positive ions when $CF_3CF=CFCF_3$ is used. Although $CF_3CF=CFCF_3$ generates fewer low-molecular-weight $CF_x$ (x=1-3) radicals (among which $CF_2$ has the highest depositing effect), which serve as primary precursors for fluorocarbon film deposition, than c-$C_4F_8$ does, the use of $CF_3CF=CFCF_3$ results in levels of fluorocarbon film evenness that are improved at least twice as much, and film density that is 1.1 times higher per 1 nanometer. These results mean that $CF_3^+$, which has a high etching efficiency, is generated in the plasma from a $CF_3CF$ fragment and molecules with a structure having a double bond with a weak bond strength, and that fewer polymer radicals are generated and radicals derived from the $CF_3CF$ form high-density, even fluorocarbon films.

Silicon materials such as silicon oxide films and/or silicon containing, low-dielectric constant films may be those films that contain F in a silicon oxide film such as SiOF and the like, silicon nitride films, etc. Silicon materials are not limited to those having a film or layer structure, and include those in which the whole having a silicon-containing chemical formula is composed of the material. A solid material such as glass, quartz plate or the like, can be cited as an example.

Through the use of the dry etching gas of the present invention, silicon materials such as silicon oxide films and/or silicon containing, low-dielectric constant films can be selectively etched in the presence of masks such as resist, polysilicon and the like; underlying layers such as silicon, silicon nitride film, silicide, metal nitride and the like; stopper films such as silicon nitride film, silicon carbide film and the like.

The preferred etching conditions are as follows.
Discharge power: 200 to 3,000 W, and preferably 400 to 2,000 W.
Bias power: 25 to 2,000 W, and preferably 100 to 1,000 W.
Pressure: 30 mTorr (3.99 Pa) or less, and preferably 2 to 10 mTorr (0.266 to 1.33 Pa).
Electron density: $10_9$ to $10^{13}$ cm$^{-3}$, and preferably $10^{10}$ to $10^{12}$ cm$^{-3}$.
Electron temperature: 2 to 9 eV, and preferably 3 to 8 eV.
Wafer temperature: −40 to 100° C., and preferably −30 to 50° C.
Chamber wall temperature: −30 to 300° C., and preferably 20 to 200° C.

Discharge power and bias power vary according to the chamber and electrode sizes. When patterns such as a contact hole and the like are etched on a silicon oxide film and/or a silicon nitride film and/or a silicon-containing, low-dielectric constant film by an inductively coupled plasma (ICP) etching device (chamber volume: 3,500 cm$^3$) designed for small-diameter wafers, the preferable conditions are:
Discharge power: 200 to 1,000 W, and preferably 300 to 600 W; and
Bias power: 50 to 500 W, and preferably 100 to 300 W.

These values increase as the wafer diameter increases.

In the gas plasma of the dry etching gas of the invention, $CF_3^+$ is selectively generated from $CF_3CF$ fragments, and also radicals derived from the $CF_3CF$ fragments are generated. $CF_3^+$ improves etching efficiency and is, thereby, capable of etching at a low bias power, resulting in reduced damage to resists and underlying layers such as silicon, etc. The radicals generated from the $CF_3CF$ fragments form an etching reaction layer and a protective layer that are composed of a high density, even fluorocarbon polymer film and increase the etching efficiency of the materials to be etched and protect resists, underlying layers such as silicon and the like, and stopper films such as silicon nitride, silicon carbide and the like. By the irradiation of $CF_3^+$ that has high etching efficiency onto even, high-density films formed from the radicals derived from $CF_3CF$, the present invention achieves etching that is well-balanced and free of etch stop, in which the etching rate is only slightly dependent on the size of hole, line or the like.

BEST MODE FOR CARRYING OUT THE INVENTION

Examples and comparative examples are given below to illustrate the invention in more detail.

Example 1 and Comparative Example 1

Using cyclic $C_4F_8$ (Comparative Example 1) and $CF_3CF=CFCF_3$ (Example 1) as etching gases, semiconductor substrates with a silicon dioxide ($SiO_2$) film formed on top of an Si substrate and a resist pattern with a 0.2-μm-diameter hole formed therein were etched to the depth of 1 μm under the conditions of 600 W of IPC (Inductive Coupled Plasma) discharge power, 200 W of bias power, 3 mTorr (0.399 Pa) of pressure, $8\times10^{10}$ to $2\times10^{11}$ $cm^{-3}$ of electron density, and 5 to 7 eV of electron temperature. Table 2 shows the etching rate and the hole diameter (in μm) at the bottom of the 0.2-μm-diameter hole.

TABLE 2

| | Etching gas | Etching rate of $SiO_2$ film (nm/min) | Diameter (μm) at the bottom of the 0.2-pm-diameter hole |
|---|---|---|---|
| Comp. Ex. 1 | c—$C_4F_8$ | 678 | 0.09 |
| Ex. 1 | $CF_3CF = CFCF_3$ | 643 | 0.20 |

While the etching rate of the conventional cyclic $C_4F_8$ etching gas is higher than that of $CF_3CF=CFCF_3$, the diameter at the bottom of the hole is 0.10 μm, which is smaller than the diameter at the top of the hole, indicating that the etching is likely to stop. Using $CF_3CF=CFCF_3$, etching proceeds to the bottom of the hole as is intended for the resist pattern.

Examples 2 and 3, and Comparative Example 1

Using $CF_3CF=CF_2$ gas alone (when m=0 and Z=F in $CF_3CF=CZ_{2-m}(C_nF_{2n+1})_m$), a mixed gas of $CF_3CF=CF_2$ and $CH_2F_2$ (flow rate: 45%/55%), and a mixed gas of $CF_3CF=CF_2$ and $CH_2F_2$ (flow rate: 20%/80%), contact holes were etched under the conditions of 400 W of ICP (Inductive Coupled Plasma) discharge power, 25 W of bias power and 5 mTorr (0.665 Pa) of pressure. Using a conventional etching gas of a mixed gas of c-$C_4F_8$, $CH_2F_2$ and $O_2$ (flow rate: 17%/76.6%/6.4%), a contact hole was etched under its optimum condition of 400 W of ICP discharge power, 25 W of bias power and 7.5 mTorr (9.975 Pa) of pressure. Table 3 shows the etching rate and the reduction in etching rate by comparing the etching rate with respect to a 0.2-μm-diameter contact hole and a plane surface.

TABLE 3

| | Etching gas | Flow rate (%) | Etching rate of $SiO_2$ film (nm/min) | Reduction in etching rate (%) |
|---|---|---|---|---|
| Ex. 2 | $CF_3CF = CF_2/CH_2F_2$ | 45/55 | 375 | 7 |
| Ex. 3 | $CF_3CF = CF_2/CH_2F_2$ | 20/80 | 317 | 12 |
| Comp. Ex. 2 | c—$C_4F_8/CH_2F_2/O_2$ | 17/76.6/6.4 | 319 | 17 |

Even without adding $O_2$, the reduction in the etching rate of the $CF_3CF=CF_2/CH_2F_2$ mixed gas is smaller than that of the c-$C_4F_8/CH_2F_2/O_2$ mixed gas under its optimum condition. Therefore, the etching gas of the present invention can be suitably used to etch patterns having different sizes at substantially the same etching rate, and minimize the etching time of the underlying layers to produce semiconductor devices with little damage.

The invention claimed is:

1. A dry etching method comprising etching a silicon material selected from the group consisting of a silicon oxide film, a silicon nitride film by means of a gas plasma of a dry etching gas consisting of (i) $CF_3CF=CFCF_3$ and (ii) at least one member selected from the group consisting of $(CF_3)_2C=O$, $CF_3CFOCF_2$, $CF_3CH_2F$ and $CF_2=CFCF=CF_2$,
    wherein $CF_3CF=CFCF_3$ is used in a flow rate of between 20 and 95%.

2. A dry etching gas for etching a silicon oxide film and/or a silicon nitride film consisting of (i) $CF_3CF=CFCF_3$ and (ii) at least one member of gas selected from the group consisting of $(CF_3)_2C=O$, $CF_3CFOCF_2$, $CF_3CH_2F$, and $CF_2=CFCF=CF_2$,
    wherein the content of $CF_3CF=CFCF_3$ in the dry etching gas is between 20 and 95% by volume.

3. A dry etching method comprising etching a silicon material selected from the group consisting of a silicon oxide film, a silicon nitride film by means of a gas plasma of a dry etching gas consisting of (i) $CF_3CF=CFCF_3$ and (ii) at least one member selected from the group consisting of $(CF_3)_2C=O$, $CF_3CFOCF_2$, $CF_3CH_2F$ and $CF_2=CFCF=CF_2$,
    wherein the content of $CF_3CF=CFCF_3$ in the dry etching gas is between 20 and 95% by volume.

* * * * *